(12) United States Patent
Moteki et al.

(10) Patent No.: US 7,985,485 B2
(45) Date of Patent: Jul. 26, 2011

(54) COPPER FOIL FOR HIGH FREQUENCY CIRCUIT, METHOD OF PRODUCTION AND APPARATUS FOR PRODUCTION OF SAME, AND HIGH FREQUENCY CIRCUIT USING COPPER FOIL

(75) Inventors: Takami Moteki, Tokyo (JP); Yuuji Suzuki, Tokyo (JP); Kazuhiro Hoshino, Tokyo (JP); Kensaku Shinozaki, Tokyo (JP); Akira Matsuda, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 12/556,410

(22) Filed: Sep. 9, 2009

(65) Prior Publication Data

US 2009/0324988 A1 Dec. 31, 2009

Related U.S. Application Data

(63) Continuation of application No. 10/768,704, filed on Feb. 2, 2004, now abandoned.

(30) Foreign Application Priority Data

Feb. 4, 2003 (JP) .................................. 2003-026629

(51) Int. Cl.
*B32B 15/20* (2006.01)
*C25D 1/04* (2006.01)
*C25D 7/06* (2006.01)

(52) U.S. Cl. .......... 428/607; 428/675; 428/935; 205/77; 205/152; 205/182

(58) Field of Classification Search ........................ None
See application file for complete search history.

(56) References Cited

U.S. PATENT DOCUMENTS

| | | |
|---|---|---|
| 3,220,897 A | 11/1965 | Conley et al. |
| 3,293,109 A | 12/1966 | Luce et al. |
| 5,447,619 A | 9/1995 | Wolski et al. |
| 5,545,466 A | 8/1996 | Saida et al. |
| 5,834,140 A | 11/1998 | Wolski et al. |
| 6,132,887 A | 10/2000 | Clouser et al. |
| 6,270,648 B1 | 8/2001 | Yates et al. |
| 2002/0015833 A1 | 2/2002 | Takahashi et al. |
| 2002/0023844 A1 | 2/2002 | Yates et al. |
| 2005/0142374 A1 | 6/2005 | Chen et al. |
| 2005/0174722 A1 | 8/2005 | Hiranaka et al. |
| 2007/0042212 A1* | 2/2007 | Moteki et al. ................. 428/606 |

FOREIGN PATENT DOCUMENTS

| | | |
|---|---|---|
| EP | 0 568 733 A2 | 11/1993 |
| EP | 1 065 298 A2 | 1/2001 |
| JP | 05-029740 A | 2/1993 |
| JP | 06-081186 A | 3/1994 |

(Continued)

*Primary Examiner* — John J Zimmerman
(74) *Attorney, Agent, or Firm* — Arent Fox, LLP (57) ABSTRACT

A copper foil reducing transmission loss at a high frequency and excellent in bond strength with a resin substrate, including at least a granular layer and a columnar layer in its thickness direction, the columnar layer being formed on at least one surface of the granular layer forming the copper foil or the granular layer being formed on at least one surface of the columnar layer forming the copper foil, the relation of the thickness A of the granular layer and the thickness B of the columnar layer in the copper foil being preferably A/(A+B)=40 to 99%, a method of production and apparatus for production for the same, and a high frequency circuit using the same.

7 Claims, 3 Drawing Sheets

| | FOREIGN PATENT DOCUMENTS | | WO | WO 99/16935 | 4/1999 |
|----|----|----|----|----|----|
| JP | 2002-167633 | 6/2002 | WO | WO 03/105545 | 12/2003 |
| KR | 10-0291856 B1 | 6/2001 | * cited by examiner | | |

COPPER FOIL FOR HIGH FREQUENCY CIRCUIT, METHOD OF PRODUCTION AND APPARATUS FOR PRODUCTION OF SAME, AND HIGH FREQUENCY CIRCUIT USING COPPER FOIL

CROSS REFERENCE TO RELATED APPLICATION

This application is a continuation application of U.S. application Ser. No. 10/768,704, filed Feb. 2, 2004, now abandoned, which claims priority to Japanese Application No. 2003-026629, filed Feb. 4, 2003, the disclosure of the prior application is hereby incorporated in their entirety by reference.

BACKGROUND OF THE INVENTION

1. Field of the Invention

The present invention relates to a copper foil reducing conductor loss in high frequency applications and superior in bond strength with a substrate, more particularly a copper foil superior for use in a high frequency circuit, for example, relates to a copper foil optimal for a high frequency circuit including an antenna of an IC card; a method of production and apparatus for production for the copper foil; and a high frequency circuit using that copper foil.

2. Description of the Related Art

As the resin of a substrate of a printed circuit board handling a high frequency signal, a polyimide resin, modified polyimide resin, fluororesin, polystyrene, polyethylene, polyphenylene sulfide, polyphenyloxide, polytetrafluoroethylene, etc. is used. For the conductor circuits, normally copper foil is used since its conductivity is high and it is resistant to stain.

A printed circuit board for a high frequency circuit has to be reduced in transmission loss in order to maintain and secure the quality of signal. If viewing the transmission loss from the perspective of the copper foil forming the base of the conductor circuits, the increase in transmission loss due to conductor loss and the drop in bond strength with the resin accompanying the reduction in dielectric constant and reduction in dielectric dissipation factor of the substrate in order to keep down the dielectric loss (drop in bond strength of copper foil and circuit board) become problems.

Among these, the conductor loss is directly related to the copper foil. If the signal becomes high in frequency, the loss is increased due to the increase in the skin resistance. At a high frequency, the skin effect (where passage of an alternating current through the conductor results in a change in the magnetic flux and therefore the occurrence of an inverse electromotive force at the center of the conductor and a consequent difficulty in flow in current) means that the current will flow at the surface portion of the conductor. Therefore, the effective sectional area through which the current flows decreases and the resistance rises.

The relationship between the frequency and depth of flow of current (skin depth) in a copper foil is calculated as being about 20 μm at 10 MHz, about 3 μm at 0.5 GHz, about 2 μm at 1 GHz, and about 0.6 μm at 10 GHz. There is a large effect due to the drop in dielectric constant accompanying slight roughness of the surface or content of impurities.

Therefore, the profile of the copper foil at the surface has a great effect on the transmission loss. A very rough copper foil has a longer signal propagation distance, resulting in problems of signal attenuation or delay. That is, the smoother the surface, the smaller the conductor loss.

The dielectric loss is determined by the dielectric constant and dielectric dissipation factor of the substrate resin. If a pulse signal is run through a circuit, a change will occur in the electric field surrounding the circuit. When the period (frequency) of change of the electric field approaches the relaxation time of polarization of the resin, a delay will be caused in the electric displacement. At this time, molecular friction will occur inside the resin and heat will be generated. This heat will result in dielectric loss. Therefore, the resin for a high frequency substrate preferably is resistant to polarization due to change in the electrical field, that is, is a resin reduced in or free of substituent groups with a large polarity. On the other hand, however, substituent groups with a large polarity contribute greatly to the chemical bonding of the resin and copper foil. A resin reduced in substituent groups with a large polarity so as to reduce the dielectric constant and dielectric dissipation factor becomes poor in bondability with copper foil resulting in a sharp drop in the peel strength of the circuit. The generally used FR-4 material gives a high peel strength due to cohesion destruction (in the resin), but with low dielectric dissipation factor substrates, interfacial destruction (interface of copper foil and resin) occurs and a high peel strength cannot be obtained. With such a low peel strength, there is a possibility of circuit peeling or mounted parts dropping off at the outermost layer in the process of production of a printed circuit board.

The problem of the peel strength can be circumvented by use of a copper foil with a large roughness, but in high frequency applications, as explained above, the transmission loss would become greater, so use would become difficult. That is, a good peel strength and transmission loss are properties difficult to secure at the same time.

In recent high performance electronic equipment, however, due to the demands for smaller size and higher processing speeds, the materials used for the circuit interconnects are required to be made thinner to assist reduction of pitch and weight and to be made lower in impedance with respect to high frequency current. One example is an IC card.

An IC card is a card with a built-in IC chip and enables more sophisticated judgments and more complicated processing. The storage capacity is about 100 times larger than that of a magnetic card. Further, since information can be both read and written, security is higher. The method of transmission of information of such an IC card includes not only the direct contact type for exchange of data by physical contact with a contact point, but also the noncontact type enabling exchange of data over a spatial distance of as much as several meters using electromagnetic waves etc.

Direct contact type IC cards utilizing the above features are expected to find use in an extremely broad range of fields such as ID cards, train/bus tickets, commuter passes, electronic money, highway passes, health insurance cards, residence cards, medical cards, logistics control cards, etc.

Further, noncontact type IC cards are divided into four types according to the communications distance such as the close coupled type (communication distance up to 2 mm), proximity type (10 cm), vicinity type (70 cm), and microwave (several meters). The communication frequencies are 4.91 MHz for the close coupled type, 13.56 MHz for the proximity type and vicinity type, and 2.45 and 5.8 GHZ for the microwave type—thereby extending from the MHz to the GHz region.

A noncontact IC card is basically constructed from an insulation sheet, antenna, and IC chip. The IC chip incorporates a ferroelectric memory, a nonvolatile memory, ROM, RAM, modem circuit, power supply circuit, enciphering circuit, control circuit, etc. As the antenna member, there are for example a coated copper coil, silver paste, aluminum foil, copper foil, etc. These are selected for use according to the number of turns, application, production cost, etc. When the number of turns is small and a high conductivity is required, rolled copper foil or electrodeposited copper foil is often used as the antenna material.

However, while the high strength, high conductivity copper alloys in use now as lead frame materials have a higher material strength compared with pure copper foil, they are becoming insufficient for coping with the demands of recent years for higher speed signal transmission, smaller size, and greater reliability. Use of copper alloys improved in properties compared with conventional copper alloys is being proposed to deal with the demands for fine pitches and lighter weight (for example, see Japanese Unexamined Patent Publication (Kokai) No. 2002-167633), but none of these has satisfied the requirements of an antenna material of sufficient bond strength with a resin and reduced transmission loss in the high frequency region.

SUMMARY OF THE INVENTION

An object of the present invention is to provide a copper foil reducing transmission loss at a high frequency when used as a material for a high frequency circuit and excellent in bond strength with a resin substrate, a method of production and apparatus for production for the same, and a high frequency circuit using the same.

The inventors engaged in intensive research to achieve the above object and as result developed a copper foil having a small transmission loss in the high frequency region and having a high bonding strength with a resin substrate and a method of production and apparatus for production for the same.

According to a first aspect of the present invention, there is provided a copper foil for a high frequency circuit comprising at least one granular layer and columnar layer in a thickness direction.

According to a second aspect of the present invention, there is provided a copper foil for a high frequency circuit comprising a granular layer forming the copper foil and a columnar layer formed on at least one surface of the same.

According to a third aspect of the present invention, there is provided a copper foil for a high frequency circuit comprising a columnar layer forming the copper foil and a granular layer formed on at least one surface of the same.

Preferably the relation between a thickness A of the granular layer forming the copper foil and the thickness B of the columnar layer is $A/(A+B)=40$ to 99%.

Preferably at least one surface is roughened.

More preferably, at least one surface is subjected to at least one of plating by nickel, zinc, chrome, alloys of the same, chromate treatment, organic stainproof treatment, and silane coupling agent treatment.

According to a fourth aspect of the present invention, there is provided a method of production of a copper foil for a high frequency circuit comprising immersing and rotating a foil-making drum in an electroforming cell to form a granular layer on the surface of the foil-making drum, then plating a columnar layer on at least one surface of the same.

According to a fifth aspect of the present inventions there is provided a method of production of a copper foil for a high frequency circuit comprising immersing and rotating a foil-making drum in an electroforming cell to form a columnar layer on the surface of the foil-making drum, then plating a granular layer on at least one surface of the same.

According to a sixth aspect of the present invention, there is provided an apparatus for production for a copper deposited layer for a high frequency circuit working a method of production as set forth above comprising immersing and rotating a foil-making drum in an electroforming cell for making a granular layer and columnar layer and continuously electrodepositing a granular layer and columnar layer on the foil-making drum.

According to a seventh aspect of the present invention, there is provided a high frequency circuit fabricated using a copper foil as set forth above, a copper foil produced by a method of production as set forth above, or a copper foil produced by an apparatus for production as set forth above.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Preferred embodiments of the present invention will be described in detail below while referring to the attached figures.

On the surface of a copper foil, generally, if the columnar layer becomes thicker, the surface roughness increases. On the other hand, in the case of a granular layer, the surface tends to be smoothed. Therefore, with only these single layers, it is difficult to control the surface roughness and the actual surface area ratio.

If the copper foil is run through with current at a high frequency, the resistance increases sharply due to the skin effect. This invites an increase in the impedance and makes normal signal transfer impossible in some cases. This phenomenon was analyzed and as a result it was learned that if using a conventional rolled copper alloy material, since the conductivity is lower than with pure copper etc., the influence of the skin effect is large and the possible range of use is extremely narrow.

Further, even when the surface is rough, the above trouble occurs. It was learned that, as an indicator of surface roughness, both Rz and Ra and the ratio of the apparent surface area with the actual surface area are effective.

That is, Rz should be not more than 5.0 µm, while Ra should be not more than 0.5 µm. On the other hand, if the surface is too smooth, the bond strength with a resin will fall, so Rz should be at least 1 µm and Ra at least 0.2 µm.

Rz, Ra, and the ratio between the apparent surface area and actual surface area may be measured under the following conditions using for example a Keyence superdeep shape measurement microscope Model VK8500:

| Measurement conditions | |
|---|---|
| Lens magnification: | 2000X |
| Run mode: Sensitivity | Color superdeep |
| Monochrome: | Gamma 3 |
| Color | Gamma 1 |
| Pitch: | 0.05 μm |

In the present invention, the above roughness or actual surface area ratio of a copper foil can be obtained by use of at least one granular layer and columnar layer in the thickness direction of the copper foil. The ratio between the thickness A of the granular layer and the thickness B of the columnar layer, that is, A/(A+B), is preferably 40 to 99%, particularly preferably 50 to 99%, according to research findings.

The granular layer and the columnar layer can be fabricated separately simply by changing the electrolytic baths for the plating, but it is also possible to use the same electrolytic bath and change the current density to form the two layers.

Further, from the standpoint of the high frequency characteristics, it is not preferable to perform on the surface a roughening treatment, a stainproof treatment, etc., but when further bondability with a resin etc. or corrosion resistance is required, it is sometimes preferable to apply such treatment even at the partial sacrifice of the high frequency characteristics.

A roughening layer applied in a roughening treatment means a layer obtained by an apparatus as shown for example in the later mentioned FIG. 4 by causing electrodeposition of fine particles of copper or copper and cobalt, nickels iron, and chrome or mixtures of these with oxides of vanadium, molybdenum, tungsten, and other elements and smoothly plating over these with copper to prevent particles from falling off. Normally, an amount of deposition of at least 0.01 mg/dm$^2$ is sufficient for improving the bonding strength with the substrate resin.

Further, it is also possible to apply a stainproof treatment or silane coupling agent treatment over this. As stainproof treatment, in general nickel plating, zinc plating, chrome plating, or plating of alloys of the same, chromate treatment, or organic treatment by benzotriazole etc. is effective. The silane coupling agent treatment is suitably performed depending on the material of the substrate used such as the vinyl type or epoxy type.

Figure 1:
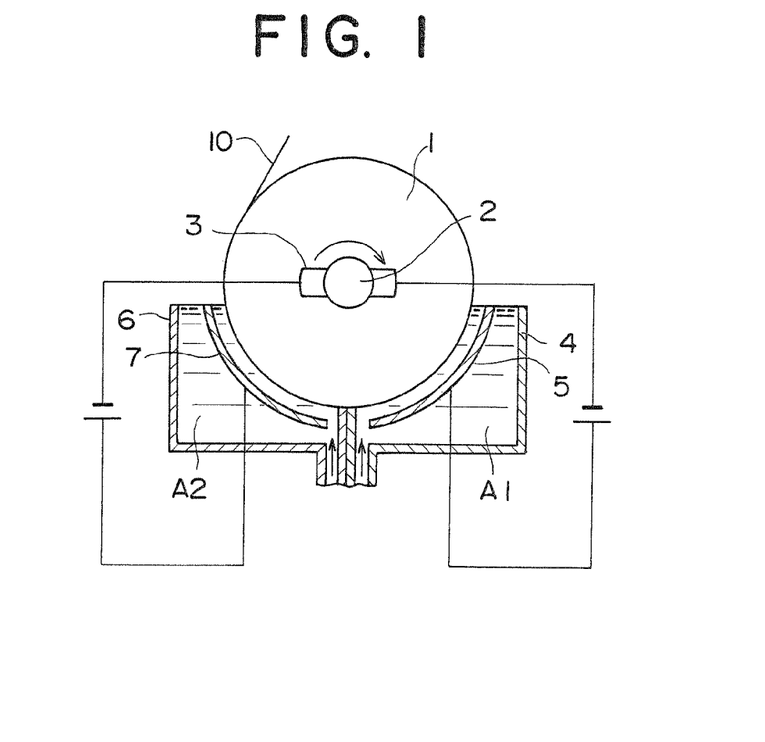
FIG. 1 is an explanatory view showing the structure of an electroforming cell showing a first embodiment of the present invention.

FIG. 1 shows an embodiment of an apparatus for producing the copper foil for a high frequency circuit of the present invention. In the figure, reference numeral 1 represents a titanium electrolytic drum forming the cathode. This drum 1 rotates at a constant speed about a shaft 2. Reference numeral 3 is a power feed unit for passing current through the electrolytic drum 1 serving as the cathode Reference numeral 4 is a first plating tank. The plating tank 4 is filled with an electrolytic solution A1 causing deposition of the electrodeposited foil serving as the granular layer on the surface of the electrolytic drum 1. Reference numeral 5 is an electrode serving as the anode provided in the plating tank 4. Reference numeral 6 is a second plating tank. The plating tank 6 is filled with an electrolytic solution A2 for causing deposition of the electrolytic layer serving as the columnar layer on the granular layer formed on the surface of the electrolytic drum 1. Reference numeral 7 is an electrode serving as an anode provided at the plating tank 6.

As illustrated, the electrolytic drum 1 is made to turn so as to successively pass through the first plating tank 4 and the second plating tank 6 in that order. The copper foil 10 deposited on the drum 1 is peeled off from the drum 1 when emerging from the second plating tank 6, whereby the final product is obtained. In this way, by rotating the electrolytic drum 1, it is possible to continuously produce a copper foil comprised of a granular layer on which a columnar layer is formed.

Further, by switching the order of the electrolytic solutions A1 and A2, it is possible to form a copper foil comprised of a columnar layer on which a granular layer is formed.

Figure 2:
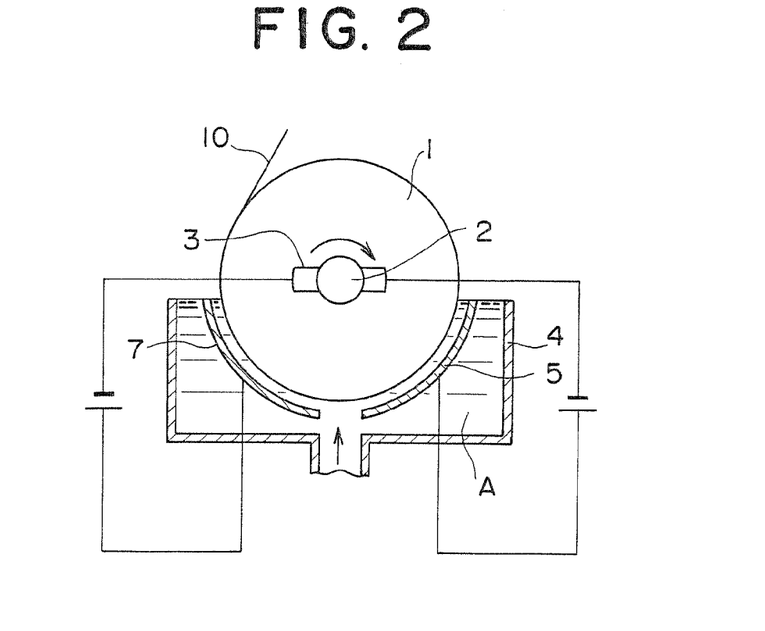
FIG. 2 is an explanatory view showing an electroforming cell showing a second embodiment of the present invention.

FIG. 2 shows a second embodiment of the present invention. Parts common with FIG. 1 are assigned the same reference numerals. FIG. 2 shows an apparatus for production of a copper foil which uses a common plating solution and changes the current density of the anode to cause deposition of a granular layer and a columnar layer. The electrolytic drum 1, immediately upon immersion in the plating solution A, has an electrolytic deposit formed on it by a current density giving a granular layer by a first anode electrode 5, then has an electrolytic deposit formed on it by a current density giving a columnar layer by a second electrode 7. After emerging from the plating solution, the copper foil 10 produced is peeled off from the electrolytic drum 1, whereby the final product is obtained.

Further, by reversing the order of the current densities of the anode from the above, it is possible to produce a copper foil comprised of a columnar layer on which a granular layer is formed.

Figure 3:
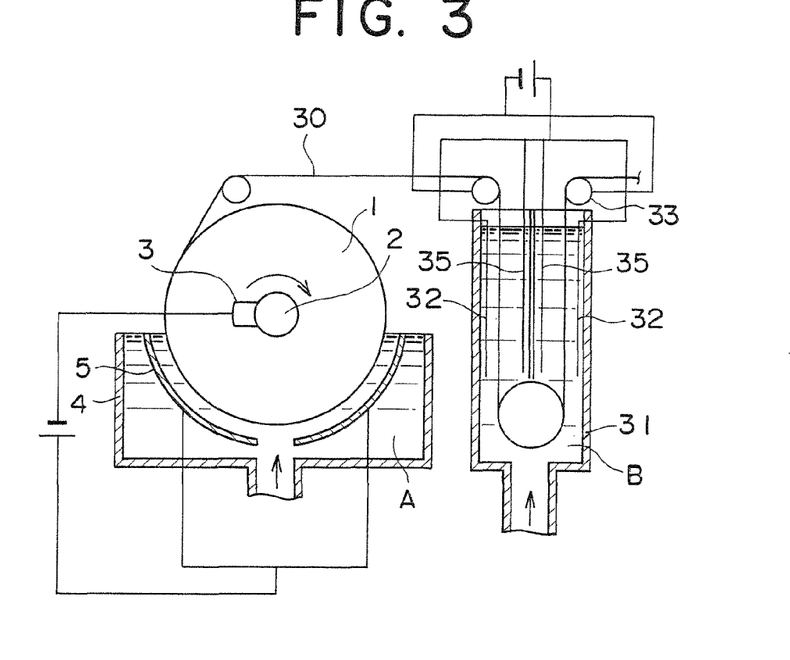
FIG. 3 is an explanatory view showing an electroforming cell showing a third embodiment of the present invention.

FIG. 3 shows a third embodiment of the present invention. Parts common with FIG. 1 and FIG. 2 are assigned the same reference numerals. FIG. 3 shows an electrolytic drum 1 rotated in a first plating tank 4 to form a granular layer (or columnar layer) on the drum 1, peeling off the copper foil 30 formed on the drum 1 from the drum 1 when leaving the first plating tank 4, then dipping it in the electrolytic tank 31. The electrolytic tank 31 is comprised of electrodes 32 and 35 serving as anodes and a power feed unit 33 using the copper foil 30 as a cathode. The electrolytic tank 31 is filled with a plating solution B.

Note that only one of the electrodes 32 and 35 is run through with current when causing the plating layer to deposit on one surface of the copper foil. Both of the electrodes are run through with current when causing the plating layer to deposit on both surfaces of the copper foil. In this way, a copper foil comprised of a granular layer and columnar layer is produced.

That is, to produce the copper foil in FIG. 3, the electrolytic drum 1 is rotated to continuously produce a copper foil 30 compared of the granular layer (or columnar layer), then the copper foil 30 is introduced into the electrolytic tank 31 to form a columnar layer (or granular layer) on one or both surfaces.

Figure 4:
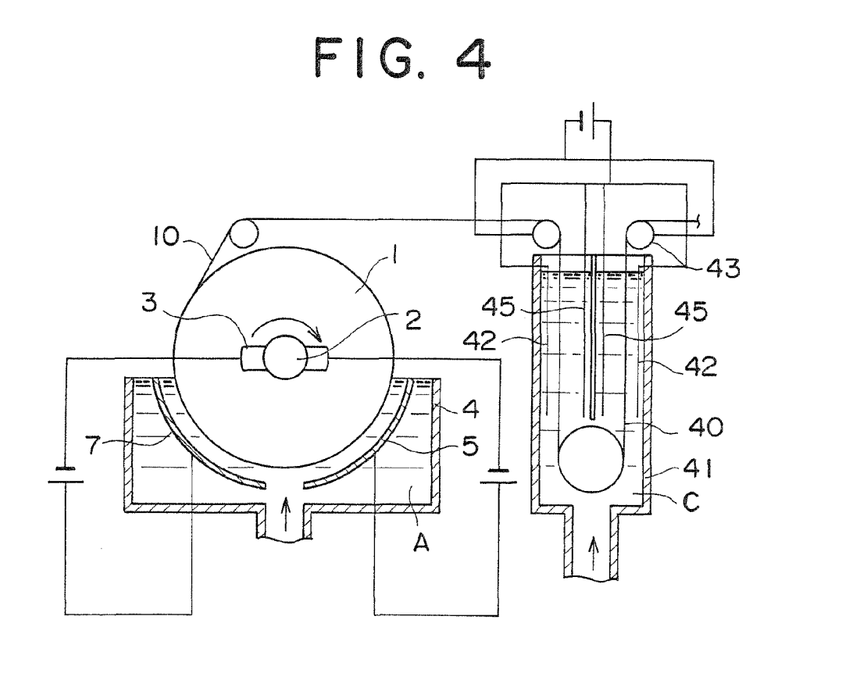
FIG. 4 is an explanatory view showing an apparatus for a surface treatment performed continuously after an electroforming cell showing a fourth embodiment of the present invention.

FIG. 4 shows a fourth embodiment of the present invention. Parts common with FIG. 2 are assigned the same reference numerals. FIG. 4 shows the post-treatment process of the copper foil produced by the apparatus of FIG. 2. Reference numeral 41 is a plating tank comprised of an electrode 42 serving as the anode and a power feed unit 43 having the copper foil 40 as a cathode. The plating solution B filled in the plating tank 41 is made the formulation required for surface treatment of the copper foil. For example a copper, nickel, zinc, chromium, or other plating solution is filled.

Note that reference numeral 45 indicates an electrode serving as an anode. The electrodes 42 and 45 are selectively used to enable either one of the surfaces of the copper foil or both of the surfaces to be roughened or otherwise treated.

Using the apparatus shown in FIG. 4, the copper foil 10 peeled off from the electrolytic drum 1 is continuously guided into the plating tank 41 and roughened at its surface at the plating tank 41.

Figure 5:
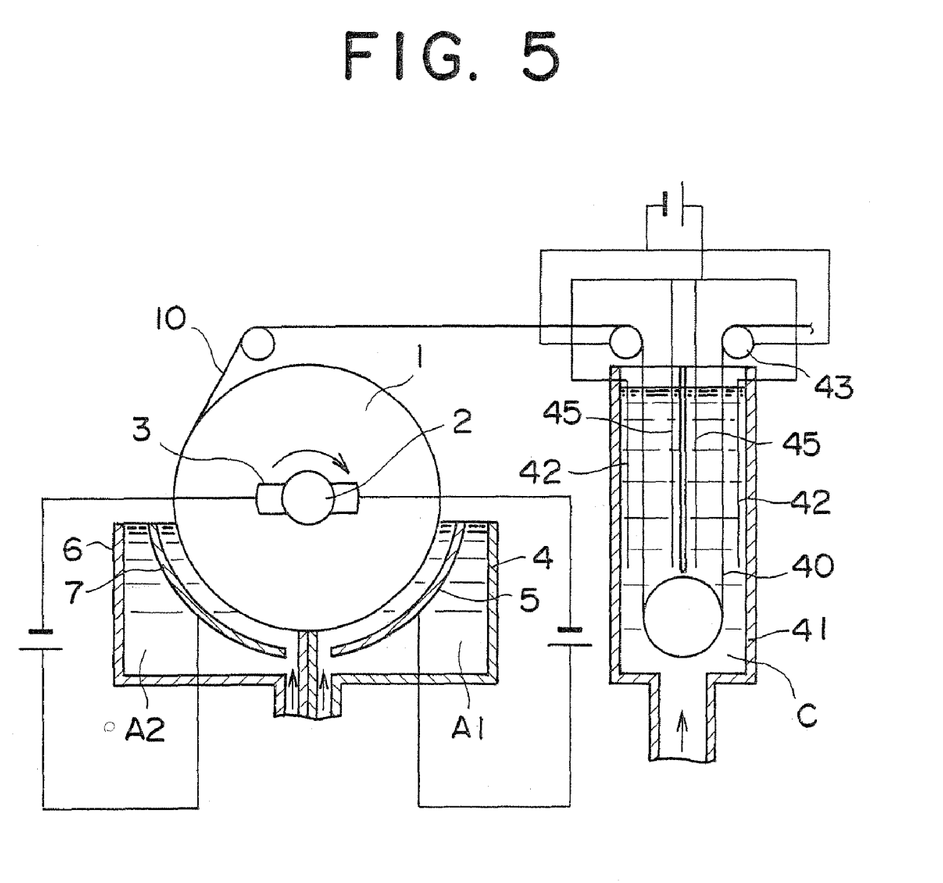
FIG. 5 is an explanatory view showing an apparatus for a surface treatment performed continuously after an electroforming cell showing a fifth embodiment of the present invention.

FIG. 5 shows a fifth embodiment of the present invention. Parts common with FIG. 1 and FIG. 4 are assigned the same reference numerals. FIG. 5 shows the post-treatment process of the copper foil produced by the apparatus of FIG. 1. The copper foil 10 peeled off from the electrolytic drum 1 is continuously guided into the plating tank 41 and roughened at its surface at the plating tank 41.

Note that FIG. 4 to FIG. 5 show processes for in-line post-treatment of the copper foils peeled off from the electrolytic drum 1, but it is also possible to once wind the copper foil peeled off from the electrolytic drum 1 on a bobbin etc. and then apply roughening treatment to it as required.

EXAMPLES

Next, the present invention will be explained in detail in accordance with examples with reference to the drawings. These examples are given for the purpose of generally explaining the present invention and do not have any limitative meaning at all.

1. Plating and Surface Treatment Conditions in Examples (1) Granular Layer Plating Conditions

| Plating bath | |
| --- | --- |
| Cu: | 90 g/liter |
| $H_2SO_4$: | 110 g/liter |
| Sodium 3-mercapto-1-propanosulfonate: | 1 ppm |
| Hydroxyethylcellulose: | 5 ppm |
| Low molecular weight glue (molecular weight about 3000): | 5 ppm |
| Chloride ion: | 30 ppm |
| Current density: | 50 A/dm$^2$ |

(2) Columnar Layer Plating Conditions

| Plating bath | |
| --- | --- |
| Cu: | 80 g/liter |
| $H_2SO_4$: | 100 g/liter |
| Cl: | 50 ppm |
| Current density: | 30 A/dm$^2$ |

(3) Roughening Treatment Conditions

First treatment is performed and then second treatment is performed. These treatments are performed two times.

| First treatment Plating bath | |
| --- | --- |
| Cu: | 20 g/liter |
| $H_2SO_4$: | 100 g/liter |
| Bath temperature: | 25° C. |
| Current density: | 30 A/dm$^2$ |

| Second treatment Plating bath | |
| --- | --- |
| Cu: | 60 g/liter |
| $H_2SO_4$: | 100 g/liter |
| Bath temperature: | 60° C. |
| Current density: | 15 A/dm$^2$ |

(4) Ni Plating Treatment

| Plating bath | |
| --- | --- |
| $NiSO_4 \cdot 7H_2O$: | 300 g/liter |
| $NiCl_2 \cdot 6H_2O$: | 60 g/liter |
| $H_3BO_3$: | 40 g/liter |
| Current density: | 4 A/dm$^2$ |

(5) Zinc Plating Treatment

| Plating bath | |
| --- | --- |
| ZnO: | 8 g/liter |
| NaOH: | 90 g/liter |
| Current density: | 0.7 A/dm$^2$ |

(6) Chromate Treatment

| Plating bath | |
| --- | --- |
| $K_2Cr_2O_7$: | 5 g/liter |
| Current density: | 0.1 A/dm$^2$ |

(7) Silane Coupling Agent Treatment

Coating by 0.2% solution of 3-aminopropyltriethoxysilane (8) Benzotriazole Treatment Dipping in 10% aqueous solution of Chiolight C-71AT made by Chiyoda Chemical for 5 seconds 2. Measurement of Peel Strength and High Frequency Transmission Loss (1) Measurement of Peel Strength The peel strength was measured at ordinary temperature.

(2) Measurement of High Frequency Transmission Loss

The high frequency transmission loss was measured by laminating the copper foils on resin substrates, then forming patterns of interconnect lengths of 1,000 mm and line widths of 0.16 mm then measuring the transmission loss at 85° C. and 5 GHz by a Network Analyzer (Agilent Technologies Co., 8753ET).

Example 1

Using a titanium electrolytic drum polished smoothly by #2000 buff as a cathode, a 28 μm copper foil was prepared by granular layer plating. The copper foil was peeled off from the titanium electrolytic drum, then a 2 μm columnar layer was plated on its shiny side, that is, granular surface which had been in contact with titanium electrolytic drum (granular layer: about 93%). This was then further nickel plated, zinc plated, chromate treated, then treated by a silane coupling agent.

Example 2

In the same way as in Example 1, a 26 μm copper foil was prepared by granular layer plating, peeled off from the titanium electrolytic drum, plated on its shiny side with a 4 μm columnar layer (granular layer: about 87%), then further nickel plated, zinc plated, chromate treated, then treated by a silane coupling agent.

Example 3

In the same way as in Example 1, a 24 μm copper foil was prepared by granular layer plating, peeled off from the titanium electrolytic drum, plated on its shiny side with a 6 μm columnar layer (granular layer: about 80%), then further nickel plated, zinc plated, chromate treated, then treated by a silane coupling agent.

Example 4

In the same way as in Example 1, a 22 μm copper foil was prepared by granular layer plating, peeled off from the titanium electrolytic drum, plated on its shiny side with an 8 μm columnar layer (granular layer: about 73%), then further nickel plated, zinc plated, chromate treated, then treated by a silane coupling agent.

Example 5

In the same way as in Example 1, a 26 μm copper foil was prepared by granular layer plating, peeled off from the titanium electrolytic drum, plated on its shiny side with a 4 μm columnar layer (granular layer: about 87%), then roughening treated by 0.4 g/dm$^2$, further nickel plated, zinc plated, chromate treated, then treated by a silane coupling agent.

Example 6

In the same way as in Example 1, a 26 μm copper foil was prepared by granular layer plating, peeled off from the titanium electrolytic drum, plated on its shiny side with a 4 μm columnar layer (granular layer: about 87%), then roughening treated by 0.4 g/dm$^2$, further nickel plated, zinc plated, chromate treated, then treated by benzotriazole and treated by a silane coupling agent simultaneously.

Example 7

In the same way as in Example 1, a 22 μm copper foil was prepared by granular layer plating, peeled off from the titanium electrolytic drum, plated on its both surfaces with a 4 μm columnar layer (granular layer: about 73%), then roughening treated by 0.4 g/dm$^2$ on the shiny side at the time of foil production, further zinc plated, chromate treated, then treated by a silane coupling agent.

Example 8

In the same way as in Example 1, an 8 μm copper foil was prepared by granular layer plating, plated on its matte side, that is, side opposite to shiny side with a 22 μm columnar layer (granular layer: about 27%), then roughening treated by 0.4 g/dm$^2$, then chromate treated.

Example 9

Using a titanium electrolytic drum polished smoothly by #2000 buff as a cathode, a 22 μm copper foil was prepared by columnar layer plating, then was plated on its matte side with a 8 μm granular layer (granular layer: about 27%), then nickel plated, zinc plated, chromate treated, then treated by a silane coupling agent.

Comparative Example 1

Using a titanium electrolytic drum polished smoothly by #2000 buff as a cathode, a 30 μm copper foil was prepared by granular layer plating. Its shiny side was then nickel plated, zinc plated, chromate treated, then treated by a silane coupling agent.

Comparative Example 2

In the same way as in Comparative Example 1, a 30 μm copper foil was prepared, roughening treated by 0.4 g/dm$^2$ on its shiny side, then nickel plated, zinc plated, chromate treated, then treated by a silane coupling agent.

Comparative Example 3

In the same way as in Comparative Example 1, a 30 μm foil was prepared, roughening treated by 0.4 g/dm$^2$ on its shiny side, then nickel plated, zinc plated, chromate treated, then treated by benzotriazole and treated by a silane coupling agent simultaneously.

Comparative Example 4

In the same way as in Comparative Example 1, a 30 μm copper foil was prepared, roughening treated by 0.4 g/dm$^2$ on its shiny side, then zinc plated, chromate treated, then treated by a silane coupling agent.

Comparative Example 5

In the same way as in Comparative Example 1, a 30 μm foil was prepared, roughening treated by 0.4 g/dm$^2$ on its shiny side, then chromate treated.

Comparative Example 6

Using a titanium electrolytic drum polished smoothly by #2000 buff as a cathode, a 30 μm copper foil was prepared by columnar layer plating. Its shiny side was then nickel plated, zinc plated chromate treated, then treated by a silane coupling agent.

The surface shapes of the copper foils before treatment (the Rz's, the surface area ratios), the peel strengths and the transmission losses were measured for Examples 1 to 9 and Comparative Examples 1 to 6. The results are shown in Table 1 Note that the transmission losses are shown as ratios with the transmission losses of the comparative examples.

In the table 1, Examples 1 to 4 are compared with Comparative Example 1 (the same treatment), Example 5 is compared with Comparative Example 2 (the same treatment), Example 6 is compared with Comparative Example 3 (the same treatment), Example 7 is compared with Comparative Example 4 (the same treatment), Example 8 is compared with Comparative Example 5 (the same treatment), Example 9 is compared with Comparative Example 6 (the same treatment), and Comparative Example 6 is compared with Comparative Example 1 (the same treatment).

TABLE 1

Peel Strength and Transmission Loss of Copper Foil (1)

| | Foil | Columnar layer (Granular layer as for Ex. 9) | Surface shape before treatment | | Copper roughened layer (g/dm²) | Nickel layer (mg/dm²) | Zinc layer (mg/dm²) | Chromate layer (mg/dm²) | Benzo-triazole layer | Silane coupling agent layer | Peel strength (kN/m) | Transmission loss ratio |
|---|---|---|---|---|---|---|---|---|---|---|---|---|
| | | | Rz (µm) | Surface area ratio (actual/apparent) | | | | | | | | |
| Ex. 1 | Granular layer | 2 µm on shiny side | 1.77 | 1.39 | None | 0.1 | 0.1 | 0.05 | None | Yes | 1.10 | 1.010 |
| Ex. 2 | Granular layer | 4 µm on shiny side | 1.88 | 1.46 | None | 0.1 | 0.1 | 0.05 | None | Yes | 1.19 | 1.018 |
| Ex. 3 | Granular layer | 6 µm on shiny side | 2.13 | 1.56 | None | 0.1 | 0.1 | 0.05 | None | Yes | 1.27 | 1.027 |
| Ex. 4 | Granular layer | 8 µm on shiny side | 2.74 | 1.78 | None | 0.1 | 0.1 | 0.05 | None | Yes | 1.36 | 1.042 |
| Ex. 5 | Granular layer | 4 µm on shiny side | 1.93 | 1.46 | 0.4 | 0.1 | 0.1 | 0.05 | None | Yes | 1.69 | 1.012 |
| Ex. 6 | Granular layer | 4 µm on shiny side | 1.91 | 1.46 | 0.4 | 0.1 | 0.1 | 0.05 | Yes | Yes | 1.64 | 1.010 |
| Ex. 7 | Granular layer | 4 µm each on both surface | 1.83 | 1.44 | 0.4 | None | 0.1 | 0.05 | None | Yes | 1.66 | 1.031 |
| Ex. 8 | Granular layer | 22 µm on matte side | 4.56 | 2.45 | 0.4 | None | None | 0.05 | None | None | 1.96 | 1.081 |
| Ex. 9 | Columnar layer | 8 µm on matte side | 2.97 | 1.69 | None | 0.1 | 0.1 | 0.05 | None | Yes | 1.30 | 1.032 |
| Comp. Ex. 1 | Granular layer | None | 1.61 | 1.33 | None | 0.1 | 0.1 | 0.05 | None | Yes | 0.97 | 1.000 |
| Comp. Ex. 2 | Granular layer | None | 1.61 | 1.33 | 04 | 0.1 | 0.1 | 0.05 | None | Yes | 1.48 | 1.000 |
| Comp. Ex. 3 | Granular layer | None | 1.61 | 1.33 | 0.4 | 0.1 | 0.1 | 0.05 | Yes | Yes | 1.46 | 1.000 |
| Comp. Ex. 4 | Granular layer | None | 1.61 | 1.33 | 0.4 | None | 0.1 | 0.05 | None | Yes | 1.46 | 1.000 |
| Comp. Ex. 5 | Granular layer | None | 1.61 | 1.33 | 0.4 | None | None | 0.05 | None | None | 1.37 | 1.000 |
| Comp. Ex. 6 | Columnar layer | None | 3.41 | 1.72 | None | 0.1 | 0.1 | 0.05 | None | Yes | 1.35 | 1.051 |

Comparing the examples and comparative examples by Table 1, Examples 1 to 4 were examples of plating the shiny sides of the copper foils of the granular layers with columnar layers, then nickel plating them, zinc plating them, chromate treating them, then treating them with silane coupling agents. Compared with Comparative Example 1 with similar treatments the thicker the columnar layers, then greater the Rz's and surface area ratios (actual/apparent) and the higher the peel strengths as well.

Further, comparing Example 4 with Comparative Example 6 (copper foil comprised of columnar layer), while the peel strength was about the same, the transmission loss ratio became smaller.

In Example 5, the shiny side of the copper foil of a granular layer of 26 µm was plated with a columnar layer to 4 µm and roughening treated by 0.4 g/dm², then nickel plated, zinc plated, chromate treated, and treated by a silane coupling agent. Compared with Comparative Example 2 with similar treatment, the peel strength rose.

In Example 6, the shiny side of the copper foil of a granular layer of 26 µm was plated with a columnar layer to 4 µm and roughening treated by 0.4 g/dm², then nickel plated, zinc plated, chromate treated, and treated by benzotriazole and treated by a silane coupling agent simultaneously. Compared with Comparative Example 3 with similar treatment, the peel strength rose.

In Example 7, the both surfaces of the copper foil of a granular layer of 22 µm were plated with columnar layers to 4 µm, then one side was roughening treated by 0.4 g/dm², then zinc plated, chromate treated, and treated by a silane coupling agent. Compared with Comparative Example 4 with similar treatment, the peel strength rose.

In Example 8, the matte side of the copper foil of a granular layer of 8 µm was plated with a columnar layer to 22 µm and roughening treated by 0.4 g/dm², then chromate treated. Compared with Comparative Example 5 with similar treatment, the peel strength rose.

In Example 9, the matte side of the copper foil of a columnar layer of 22 µm was plated with a granular layer to 8 µm, then nickel plated, zinc plated, chromate treated, and treated by a silane coupling agent. Compared with Comparative Example 6 with similar treatment, the transmission loss ratio became smaller.

Comparative Examples 6, a 30 µm copper foil was prepared by columnar layer plating. Its shiny side was then nickel plated, zinc plated, chromate treated, and treated by a silane coupling agent, but due to the difference in Rz, Comparative Example 6 has a larger transmission loss ratio compared with Comparative Example 1.

Comparative Example 7

In the same way as in Comparative Example 1, a 30 µm copper foil was prepared, roughening treated by 0.1 g/dm² on its shiny side, then nickel plated, zinc plated, chromate treated, then treated by a silane coupling agent.

Comparative Example 8

In the same way as in Comparative Example 1, a 30 µm copper foil was prepared, roughening treated by 0.2 g/dm² on its shiny side, then nickel plated, zinc plated, chromate treated, then treated by a silane coupling agent.

Comparative Example 9

In the same way as in Comparative Example 1, a 30 μm copper foil was prepared, roughening treated by 0.3 g/dm² on its shiny side, then nickel plated, zinc plated, chromate treated, then treated by a silane coupling agent.

Comparative Example 10

In the same way as in Comparative Example 1, a 30 μm copper foil was prepared, roughening treated by 0.4 g/dm² on its shiny side, then nickel plated, zinc plated, chromate treated, then treated by a silane coupling agent.

Comparative Example 11

In the same way as in Comparative Example 1, a 30 μm copper foil was prepared, roughening treated by 0.6 g/dm² on its shiny side, then nickel plated, zinc plated, chromate treated, then treated by a silane coupling agent.

Comparative Example 12

In the same way as in Comparative Example 1, a 30 μm copper foil was prepared, roughening treated by 0.6 g/dm² on its shiny side, then nickel plated, zinc plated, chromate treated, then treated by benzotriazole and treated by a silane coupling agent simultaneously.

Comparative Example 13

In the same way as in Comparative Example 1, a 30 μm copper foil was prepared, roughening treated by 0.6 g/dm² on its shiny side, then zinc plated, chromate treated, then treated by a silane coupling agent.

Comparative Example 14

In the same way as in Comparative Example 1, a 30 μm copper foil was prepared, roughening treated by 0.8 g/dm² on its shiny side, then chromate treated.

The surface shapes of the copper foils before treatment (the Rz's, the surface area ratios), the peel strengths and the transmission losses were measured for Examples 1 to 8 and Comparative Examples 7 to 14. The results are shown in Table 2. Note that the transmission losses are shown as ratios with the transmission losses of the comparative examples.

In the table 2, for comparison of the high frequency characteristics, as comparative foils, ones with the same surface deposits and roughened to give about the same peel strengths were used, that is, Example 1 is compared with Comparative Example 7, Example 2 is compared with Comparative Example 8, Example 3 is compared with Comparative Example 9, Example 4 is compared with Comparative Example 10, Example 5 is compared with Comparative Example 11, Example 6 is compared with Comparative Example 12, Example 7 is compared with Comparative Example 13, and Example 8 is compared with Comparative Example 14.

TABLE 2

Peel Strength and Transmission Loss of Copper Foil (2)

|  | Foil | Columnar layer | Surface shape before treatment | | Copper roughened layer (g/dm²) | Nickel layer (mg/dm²) | Zinc layer (mg/dm²) | Chromate layer (mg/dm²) | Benzo-triazole layer | Silane coupling agent layer | Peel strength (kN/m) | Transmission loss ratio |
|---|---|---|---|---|---|---|---|---|---|---|---|---|
|  |  |  | Rz (μm) | Surface area ratio (actual/apparent) |  |  |  |  |  |  |  |  |
| Ex. 1 | Granular layer | 2 μm on shiny side | 1.77 | 1.39 | None | 0.1 | 0.1 | 0.05 | None | Yes | 1.10 | 0.974 |
| Ex. 2 | Granular layer | 4 μm on shiny side | 1.88 | 1.46 | None | 0.1 | 0.1 | 0.05 | None | Yes | 1.19 | 0.921 |
| Ex. 3 | Granular layer | 6 μm on shiny side | 2.13 | 1.56 | None | 0.1 | 0.1 | 0.05 | None | Yes | 1.27 | 0.892 |
| Ex. 4 | Granular layer | 8 μm on shiny side | 2.74 | 1.78 | None | 0.1 | 0.1 | 0.05 | None | Yes | 1.36 | 0.802 |
| Ex. 5 | Granular layer | 4 μm on shiny side | 1.93 | 1.46 | 0.4 | 0.1 | 0.1 | 0.05 | None | Yes | 1.69 | 0.893 |
| Ex. 6 | Granular layer | 4 μm on shiny side | 1.91 | 1.46 | 0.4 | 0.1 | 0.1 | 0.05 | Yes | Yes | 1.64 | 0.902 |
| Ex. 7 | Granular layer | 4 μm each on both surface | 1.83 | 1.44 | 0.4 | None | 0.1 | 0.05 | None | Yes | 1.66 | 0.943 |
| Ex. 8 | Granular layer | 22 μm on matte side | 4.56 | 2.45 | 0.4 | None | None | 0.05 | None | None | 1.96 | 0.863 |
| Comp. Ex. 7 | Granular layer | None | 1.61 | 1.33 | 0.1 | 0.1 | 0.1 | 0.05 | None | Yes | 1.09 | 1.000 |
| Comp. Ex. 8 | Granular layer | None | 1.61 | 1.33 | 0.2 | 0.1 | 0.1 | 0.05 | None | Yes | 1.21 | 1.000 |
| Comp. Ex. 9 | Granular layer | None | 1.61 | 1.33 | 0.3 | 0.1 | 0.1 | 0.05 | None | Yes | 1.26 | 1.000 |
| Comp. Ex. 10 | Granular layer | None | 1.61 | 1.33 | 0.4 | 0.1 | 0.1 | 0.05 | None | Yes | 1.38 | 1.000 |
| Comp. Ex. 11 | Granular layer | None | 1.61 | 1.33 | 0.6 | 0.1 | 0.1 | 0.05 | None | Yes | 1.68 | 1.000 |
| Comp. Ex. 12 | Granular layer | None | 1.61 | 1.33 | 0.6 | 0.1 | 0.1 | 0.05 | Yes | Yes | 1.67 | 1.000 |

TABLE 2-continued

Peel Strength and Transmission Loss of Copper Foil (2)

|  | Foil | Columnar layer | Surface shape before treatment | | Copper roughened layer (g/dm²) | Nickel layer (mg/dm²) | Zinc layer (mg/dm²) | Chromate layer (mg/dm²) | Benzo-triazole layer | Silane coupling agent layer | Peel strength (kN/m) | Transmission loss ratio |
|---|---|---|---|---|---|---|---|---|---|---|---|---|
|  |  |  | Rz (μm) | Surface area ratio (actual/apparent) |  |  |  |  |  |  |  |  |
| Comp. Ex. 13 | Granular layer | None | 1.61 | 1.33 | 0.6 | None | 0.1 | 0.05 | None | Yes | 1.64 | 1.000 |
| Comp. Ex. 14 | Granular layer | None | 1.61 | 1.33 | 0.8 | None | None | 0.05 | None | Yes | 1.96 | 1.000 |

As clear from Table 2, comparing Example 1 and Comparative Example 7, Example 2 and Comparative Example 8, Example 3 and Comparative Example 9, and Example 4 and Comparative Example 10, Examples 1 to 4 were examples of plating the shiny sides of the copper foils of the granular layers with columnar layers, then nickel plating them, zinc plating them, chromate treating them, then treating them with silane coupling agents. Compared with Comparative Examples 7 to 10 roughening treatment instead of being plated with columnar layers, the transmission loss ratio became smaller.

Further, there was a tendency shown for the transmission loss ratio to become smaller the higher the peel strength.

In Example 5, the shiny side of the copper foil of a granular layer of 26 μm was plated with a columnar layer to 4 μm and roughening treated by 0.4 g/dm², then nickel plated, zinc plated, chromate treated, and treated by a silane coupling agent. Compared with Comparative Example 11 roughening treated by 0.6 g/dm² without being plated with a columnar layer, the transmission loss ratio became smaller.

In Example 6, the shiny side of the copper foil of a granular layer of 26 μm was plated with a columnar layer to 4 μm and roughening treated by 0.4 g/dm², then nickel plated, zinc plated, chromate treated, and treated by benzotriazole and treated by a silane coupling agent simultaneously. Compared with Comparative Example 12 roughening treated by 0.6 g/dm² without being plated with a columnar layer, the transmission loss ratio became smaller.

In Example 7, the both surfaces of the copper foil of a granular layer of 22 μm were plated with columnar layers to 4 μm, then one side was roughening treated by 0.4 g/dm², then zinc plated, chromate treated, and treated by a silane coupling agent. Compared with Comparative Example 13 roughening treated by 0.6 g/dm² without being plated with a columnar layer, the transmission loss ratio became smaller.

In Example 8, the matte side of the copper foil of a granular layer of 8 μm was plated with a columnar layer to 22 μm and roughening treated by 0.4 g/dm², then chromate treated. Compared with Comparative Example 14, the transmission loss ratio became smaller.

Summarizing the effects of the invention, by making a copper foil double layer structure as explained above, it is possible to improve the peel strength without reducing the high frequency characteristics and therefore possible to provide a copper foil suitable for a fine pattern printed circuit board (in particular for high frequency use), a method of production and a production apparatus for the same, and a high frequency circuit using such a copper foil.

Note that the copper foil of the present invention can also be used to good effect for COF and PDP applications, that is, its applications are not particularly limited.

While the invention has been described with reference to specific embodiments chosen for purpose of illustration, it should be apparent that numerous modifications could be made thereto by those skilled in the art without departing from the basic concept and scope of the invention.

What is claimed is:

1. A copper foil for a high frequency circuit comprising a granular layer forming the copper foil and a columnar layer formed on a shiny surface of the granular layer,
   wherein a relation between a thickness A of the granular layer forming the copper foil and a thickness B of the columnar layer is A/(A+B)=40 to 99%.

2. A copper foil for a high frequency circuit as set forth in claim 1, wherein at least one surface is roughened.

3. A copper foil for a high frequency circuit as set forth in any one of claims 1 and 2, wherein at least one surface is subjected to at least one of treating by nickel plating, zinc plating, chrome plating, nickel alloy plating, zinc alloy plating, chrome alloy plating, chromate treatment, organic rust-prevention treatment, and silane coupling agent treatment.

4. A high frequency circuit fabricated using a copper foil as set forth in claim 3.

5. A method of production of a copper foil for a high frequency circuit comprising immersing and rotating a foil-making drum in an electrolytic tank to form a granular layer on the surface of said foil-making drum, then plating a columnar layer on a shiny surface of the granular layer,
   wherein a relation between a thickness A of the granular layer forming the copper foil and a thickness B of the columnar layer is A/(A+B)=40 to 99%.

6. A high frequency circuit fabricated using a copper foil produced by a method of production as set forth in claim 5.

7. A method of production of a copper foil for a high frequency circuit comprising immersing and rotating a foil-making drum in an electrolytic tank to form a columnar layer on the surface of said foil-making drum, then plating a granular on at least one surface of the same,
   wherein the relation between a thickness A of the columnar layer forming the copper foil and the thickness B of the granular layer is A/(A+B)=40 to 99%.

* * * * *